(12) United States Patent
Kaiser et al.

(10) Patent No.: US 9,093,639 B2
(45) Date of Patent: Jul. 28, 2015

(54) METHODS FOR MANUFACTURING A MAGNETORESISTIVE STRUCTURE UTILIZING HEATING AND COOLING

(75) Inventors: Christian Kaiser, San Jose, CA (US);
Qunwen Leng, Palo Alto, CA (US);
Mahendra Pakala, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 502 days.

(21) Appl. No.: 13/401,164

(22) Filed: Feb. 21, 2012

(65) Prior Publication Data

US 2013/0216702 A1    Aug. 22, 2013

(51) Int. Cl.
*H01L 43/12* (2006.01)
*G11B 5/31* (2006.01)
*G11B 5/39* (2006.01)
*G01R 33/09* (2006.01)
*H01F 41/30* (2006.01)
*H01F 10/32* (2006.01)

(52) U.S. Cl.
CPC .............. *H01L 43/12* (2013.01); *G01R 33/093* (2013.01); *G01R 33/098* (2013.01); *G11B 5/3163* (2013.01); *G11B 5/3909* (2013.01); *H01F 41/307* (2013.01); *H01F 10/3259* (2013.01); *H01F 10/3272* (2013.01)

(58) Field of Classification Search
CPC .......... G11B 5/33; H01L 29/82; H01L 49/02; H01L 43/12; G11C 15/02
USPC ......... 428/811, 811.3, 811.1; 360/324, 342.2, 360/328; 257/421
See application file for complete search history.

(56) References Cited

U.S. PATENT DOCUMENTS

| 5,835,314 | A | * | 11/1998 | Moodera et al. ........... 360/324.2 |
|---|---|---|---|---|
| 6,016,290 | A | | 1/2000 | Chen et al. |
| 6,018,441 | A | | 1/2000 | Wu et al. |
| 6,025,978 | A | | 2/2000 | Hoshi et al. |
| 6,025,988 | A | | 2/2000 | Yan |
| 6,032,353 | A | | 3/2000 | Hiner et al. |
| 6,033,532 | A | | 3/2000 | Minami |
| 6,034,851 | A | | 3/2000 | Zarouri et al. |
| 6,043,959 | A | | 3/2000 | Crue et al. |
| 6,046,885 | A | | 4/2000 | Aimonetti et al. |
| 6,049,650 | A | | 4/2000 | Jerman et al. |
| 6,055,138 | A | | 4/2000 | Shi |
| 6,058,094 | A | | 5/2000 | Davis et al. |
| 6,073,338 | A | | 6/2000 | Liu et al. |

(Continued)

OTHER PUBLICATIONS

Maehara, et al., "Tunnel Magnetoresistance above 170% and Resistance-Area Product of 1(m)2 Attained by In situ Annealing of Ultra-Thin MgO Tunnel Barrier", The Japan Society of Applied Physics Express 4 (2011) 033002, 3 pages.

*Primary Examiner* — Michael Cleveland
*Assistant Examiner* — Tabassom Tadayyon Eslam

(57) ABSTRACT

This invention describes a novel tunnel magnetoresistive (TMR) deposition process that can enhance the signal-to-noise ratio (SNR) of a TMR reader. A method of manufacturing a tunnel magnetoresistive sensor includes providing a substrate; forming a first portion of a magnetic tunnel junction (MTJ) structure on the substrate; forming a second portion of the MTJ structure on the substrate; forming a tunnel barrier layer of the MTJ structure between the first portion and the second portion; heating the first portion of the MTJ structure before forming the tunnel barrier layer or after forming at least a portion of the tunnel barrier layer; and cooling the tunnel barrier layer.

30 Claims, 5 Drawing Sheets

(56) References Cited

U.S. PATENT DOCUMENTS

| | | | |
|---|---|---|---|
| 6,078,479 A | 6/2000 | Nepela et al. |
| 6,081,499 A | 6/2000 | Berger et al. |
| 6,094,803 A | 8/2000 | Carlson et al. |
| 6,099,362 A | 8/2000 | Viches et al. |
| 6,103,073 A | 8/2000 | Thayamballi |
| 6,108,166 A | 8/2000 | Lederman |
| 6,118,629 A | 9/2000 | Huai et al. |
| 6,118,638 A | 9/2000 | Knapp et al. |
| 6,125,018 A | 9/2000 | Takagishi et al. |
| 6,130,779 A | 10/2000 | Carlson et al. |
| 6,134,089 A | 10/2000 | Barr et al. |
| 6,136,166 A | 10/2000 | Shen et al. |
| 6,137,661 A | 10/2000 | Shi et al. |
| 6,137,662 A | 10/2000 | Huai et al. |
| 6,160,684 A | 12/2000 | Heist et al. |
| 6,163,426 A | 12/2000 | Nepela et al. |
| 6,166,891 A | 12/2000 | Lederman et al. |
| 6,173,486 B1 | 1/2001 | Hsiao et al. |
| 6,175,476 B1 | 1/2001 | Huai et al. |
| 6,178,066 B1 | 1/2001 | Barr |
| 6,178,070 B1 | 1/2001 | Hong et al. |
| 6,178,150 B1 | 1/2001 | Davis |
| 6,181,485 B1 | 1/2001 | He |
| 6,181,525 B1 | 1/2001 | Carlson |
| 6,185,051 B1 | 2/2001 | Chen et al. |
| 6,185,077 B1 | 2/2001 | Tong et al. |
| 6,185,081 B1 | 2/2001 | Simion et al. |
| 6,188,549 B1 | 2/2001 | Wiitala |
| 6,190,764 B1 | 2/2001 | Shi et al. |
| 6,193,584 B1 | 2/2001 | Rudy et al. |
| 6,195,229 B1 | 2/2001 | Shen et al. |
| 6,198,608 B1 | 3/2001 | Hong et al. |
| 6,198,609 B1 | 3/2001 | Barr et al. |
| 6,201,673 B1 | 3/2001 | Rottmayer et al. |
| 6,204,998 B1 | 3/2001 | Katz |
| 6,204,999 B1 | 3/2001 | Crue et al. |
| 6,212,153 B1 | 4/2001 | Chen et al. |
| 6,215,625 B1 | 4/2001 | Carlson |
| 6,219,205 B1 | 4/2001 | Yuan et al. |
| 6,221,218 B1 | 4/2001 | Shi et al. |
| 6,222,707 B1 | 4/2001 | Huai et al. |
| 6,229,782 B1 | 5/2001 | Wang et al. |
| 6,230,959 B1 | 5/2001 | Heist et al. |
| 6,233,116 B1 | 5/2001 | Chen et al. |
| 6,233,125 B1 | 5/2001 | Knapp et al. |
| 6,237,215 B1 | 5/2001 | Hunsaker et al. |
| 6,252,743 B1 | 6/2001 | Bozorgi |
| 6,255,721 B1 | 7/2001 | Roberts |
| 6,258,468 B1 | 7/2001 | Mahvan et al. |
| 6,266,216 B1 | 7/2001 | Hikami et al. |
| 6,271,604 B1 | 8/2001 | Frank, Jr. et al. |
| 6,275,354 B1 | 8/2001 | Huai et al. |
| 6,277,505 B1 | 8/2001 | Shi et al. |
| 6,282,056 B1 | 8/2001 | Feng et al. |
| 6,296,955 B1 | 10/2001 | Hossain et al. |
| 6,297,955 B1 | 10/2001 | Frank, Jr. et al. |
| 6,304,414 B1 | 10/2001 | Crue, Jr. et al. |
| 6,307,715 B1 | 10/2001 | Berding et al. |
| 6,310,746 B1 | 10/2001 | Hawwa et al. |
| 6,310,750 B1 | 10/2001 | Hawwa et al. |
| 6,317,290 B1 | 11/2001 | Wang et al. |
| 6,317,297 B1 | 11/2001 | Tong et al. |
| 6,322,911 B1 | 11/2001 | Fukagawa et al. |
| 6,330,136 B1 | 12/2001 | Wang et al. |
| 6,330,137 B1 | 12/2001 | Knapp et al. |
| 6,333,830 B2 | 12/2001 | Rose et al. |
| 6,340,533 B1 | 1/2002 | Ueno et al. |
| 6,349,014 B1 | 2/2002 | Crue, Jr. et al. |
| 6,351,355 B1 | 2/2002 | Min et al. |
| 6,353,318 B1 | 3/2002 | Sin et al. |
| 6,353,511 B1 | 3/2002 | Shi et al. |
| 6,356,412 B1 | 3/2002 | Levi et al. |
| 6,359,779 B1 | 3/2002 | Frank, Jr. et al. |
| 6,369,983 B1 | 4/2002 | Hong |
| 6,376,964 B1 | 4/2002 | Young et al. |
| 6,377,535 B1 | 4/2002 | Chen et al. |
| 6,381,095 B1 | 4/2002 | Sin et al. |
| 6,381,105 B1 | 4/2002 | Huai et al. |
| 6,389,499 B1 | 5/2002 | Frank, Jr. et al. |
| 6,392,850 B1 | 5/2002 | Tong et al. |
| 6,396,660 B1 | 5/2002 | Jensen et al. |
| 6,399,179 B1 | 6/2002 | Hanrahan et al. |
| 6,400,526 B2 | 6/2002 | Crue, Jr. et al. |
| 6,404,600 B1 | 6/2002 | Hawwa et al. |
| 6,404,601 B1 | 6/2002 | Rottmayer et al. |
| 6,404,706 B1 | 6/2002 | Stovall et al. |
| 6,410,170 B1 | 6/2002 | Chen et al. |
| 6,411,522 B1 | 6/2002 | Frank, Jr. et al. |
| 6,417,998 B1 | 7/2002 | Crue, Jr. et al. |
| 6,417,999 B1 | 7/2002 | Knapp et al. |
| 6,418,000 B1 | 7/2002 | Gibbons et al. |
| 6,418,048 B1 | 7/2002 | Sin et al. |
| 6,421,211 B1 | 7/2002 | Hawwa et al. |
| 6,421,212 B1 | 7/2002 | Gibbons et al. |
| 6,424,505 B1 | 7/2002 | Lam et al. |
| 6,424,507 B1 | 7/2002 | Lederman et al. |
| 6,430,009 B1 | 8/2002 | Komaki et al. |
| 6,430,806 B1 | 8/2002 | Chen et al. |
| 6,433,965 B1 | 8/2002 | Gopinathan et al. |
| 6,433,968 B1 | 8/2002 | Shi et al. |
| 6,433,970 B1 | 8/2002 | Knapp et al. |
| 6,437,945 B1 | 8/2002 | Hawwa et al. |
| 6,445,536 B1 | 9/2002 | Rudy et al. |
| 6,445,542 B1 | 9/2002 | Levi et al. |
| 6,445,553 B2 | 9/2002 | Barr et al. |
| 6,445,554 B1 | 9/2002 | Dong et al. |
| 6,447,935 B1 | 9/2002 | Zhang et al. |
| 6,448,765 B1 | 9/2002 | Chen et al. |
| 6,451,514 B1 | 9/2002 | Iitsuka |
| 6,452,742 B1 | 9/2002 | Crue et al. |
| 6,452,765 B1 | 9/2002 | Mahvan et al. |
| 6,456,465 B1 | 9/2002 | Louis et al. |
| 6,459,552 B1 | 10/2002 | Liu et al. |
| 6,462,920 B1 | 10/2002 | Karimi |
| 6,466,401 B1 | 10/2002 | Hong et al. |
| 6,466,402 B1 | 10/2002 | Crue, Jr. et al. |
| 6,466,404 B1 | 10/2002 | Crue, Jr. et al. |
| 6,468,436 B1 | 10/2002 | Shi et al. |
| 6,469,877 B1 | 10/2002 | Knapp et al. |
| 6,477,019 B2 | 11/2002 | Matono et al. |
| 6,479,096 B1 | 11/2002 | Shi et al. |
| 6,482,657 B2 | 11/2002 | Shimazawa |
| 6,483,662 B1 | 11/2002 | Thomas et al. |
| 6,487,040 B1 | 11/2002 | Hsiao et al. |
| 6,487,056 B1 | 11/2002 | Gibbons et al. |
| 6,490,125 B1 | 12/2002 | Barr |
| 6,496,330 B1 | 12/2002 | Crue, Jr. et al. |
| 6,496,334 B1 | 12/2002 | Pang et al. |
| 6,504,676 B1 | 1/2003 | Hiner et al. |
| 6,512,657 B2 | 1/2003 | Heist et al. |
| 6,512,659 B1 | 1/2003 | Hawwa et al. |
| 6,512,661 B1 | 1/2003 | Louis |
| 6,512,690 B1 | 1/2003 | Qi et al. |
| 6,515,573 B1 | 2/2003 | Dong et al. |
| 6,515,791 B1 | 2/2003 | Hawwa et al. |
| 6,532,823 B1 | 3/2003 | Knapp et al. |
| 6,535,363 B1 | 3/2003 | Hosomi et al. |
| 6,552,874 B1 | 4/2003 | Chen et al. |
| 6,552,928 B1 | 4/2003 | Qi et al. |
| 6,577,470 B1 | 6/2003 | Rumpler |
| 6,583,961 B2 | 6/2003 | Levi et al. |
| 6,583,968 B1 | 6/2003 | Scura et al. |
| 6,597,548 B1 | 7/2003 | Yamanaka et al. |
| 6,611,398 B1 | 8/2003 | Rumpler et al. |
| 6,618,223 B1 | 9/2003 | Chen et al. |
| 6,629,357 B1 | 10/2003 | Akoh |
| 6,633,464 B2 | 10/2003 | Lai et al. |
| 6,636,394 B1 | 10/2003 | Fukagawa et al. |
| 6,639,291 B1 | 10/2003 | Sin et al. |
| 6,650,503 B1 | 11/2003 | Chen et al. |
| 6,650,506 B1 | 11/2003 | Risse |
| 6,654,195 B1 | 11/2003 | Frank, Jr. et al. |
| 6,657,816 B1 | 12/2003 | Barr et al. |
| 6,661,621 B1 | 12/2003 | Iitsuka |

(56) References Cited

U.S. PATENT DOCUMENTS

| | | |
|---|---|---|
| 6,661,625 B1 | 12/2003 | Sin et al. |
| 6,674,610 B1 | 1/2004 | Thomas et al. |
| 6,680,863 B1 | 1/2004 | Shi et al. |
| 6,683,763 B1 | 1/2004 | Hiner et al. |
| 6,687,098 B1 | 2/2004 | Huai |
| 6,687,178 B1 | 2/2004 | Qi et al. |
| 6,687,977 B2 | 2/2004 | Knapp et al. |
| 6,691,226 B1 | 2/2004 | Frank, Jr. et al. |
| 6,697,294 B1 | 2/2004 | Qi et al. |
| 6,700,738 B1 | 3/2004 | Sin et al. |
| 6,700,759 B1 | 3/2004 | Knapp et al. |
| 6,704,158 B2 | 3/2004 | Hawwa et al. |
| 6,707,083 B1 | 3/2004 | Hiner et al. |
| 6,713,801 B1 | 3/2004 | Sin et al. |
| 6,721,138 B1 | 4/2004 | Chen et al. |
| 6,721,149 B1 | 4/2004 | Shi et al. |
| 6,721,203 B1 | 4/2004 | Qi et al. |
| 6,724,569 B1 | 4/2004 | Chen et al. |
| 6,724,572 B1 | 4/2004 | Stoev et al. |
| 6,729,015 B2 | 5/2004 | Matono et al. |
| 6,735,850 B1 | 5/2004 | Gibbons et al. |
| 6,737,281 B1 | 5/2004 | Dang et al. |
| 6,744,608 B1 | 6/2004 | Sin et al. |
| 6,747,301 B1 | 6/2004 | Hiner et al. |
| 6,751,055 B1 | 6/2004 | Alfoqaha et al. |
| 6,754,049 B1 | 6/2004 | Seagle et al. |
| 6,756,071 B1 | 6/2004 | Shi et al. |
| 6,757,140 B1 | 6/2004 | Hawwa |
| 6,760,196 B1 | 7/2004 | Niu et al. |
| 6,762,910 B1 | 7/2004 | Knapp et al. |
| 6,765,756 B1 | 7/2004 | Hong et al. |
| 6,775,902 B1 | 8/2004 | Huai et al. |
| 6,778,358 B1 | 8/2004 | Jiang et al. |
| 6,781,927 B1 | 8/2004 | Heanuc et al. |
| 6,785,955 B1 | 9/2004 | Chen et al. |
| 6,791,793 B1 | 9/2004 | Chen et al. |
| 6,791,807 B1 | 9/2004 | Hikami et al. |
| 6,798,616 B1 | 9/2004 | Seagle et al. |
| 6,798,625 B1 | 9/2004 | Ueno et al. |
| 6,801,408 B1 | 10/2004 | Chen et al. |
| 6,801,411 B1 | 10/2004 | Lederman et al. |
| 6,803,615 B1 | 10/2004 | Sin et al. |
| 6,806,035 B1 | 10/2004 | Atireklapvarodom et al. |
| 6,807,030 B1 | 10/2004 | Hawwa et al. |
| 6,807,332 B1 | 10/2004 | Hawwa |
| 6,809,899 B1 | 10/2004 | Chen et al. |
| 6,816,345 B1 | 11/2004 | Knapp et al. |
| 6,828,897 B1 | 12/2004 | Nepela |
| 6,829,160 B1 | 12/2004 | Qi et al. |
| 6,829,819 B1 | 12/2004 | Crue, Jr. et al. |
| 6,833,979 B1 | 12/2004 | Knapp et al. |
| 6,834,010 B1 | 12/2004 | Qi et al. |
| 6,859,343 B1 | 2/2005 | Alfoqaha et al. |
| 6,859,997 B1 | 3/2005 | Tong et al. |
| 6,861,937 B1 | 3/2005 | Feng et al. |
| 6,870,712 B2 | 3/2005 | Chen et al. |
| 6,873,494 B2 | 3/2005 | Chen et al. |
| 6,873,547 B1 | 3/2005 | Shi et al. |
| 6,879,464 B2 | 4/2005 | Sun et al. |
| 6,888,184 B1 | 5/2005 | Shi et al. |
| 6,888,704 B1 | 5/2005 | Diao et al. |
| 6,891,702 B1 | 5/2005 | Tang |
| 6,894,871 B2 | 5/2005 | Alfoqaha et al. |
| 6,894,877 B1 | 5/2005 | Crue, Jr. et al. |
| 6,906,894 B2 | 6/2005 | Chen et al. |
| 6,909,578 B1 | 6/2005 | Missell et al. |
| 6,912,106 B1 | 6/2005 | Chen et al. |
| 6,934,113 B1 | 8/2005 | Chen |
| 6,934,129 B1 | 8/2005 | Zhang et al. |
| 6,940,688 B2 | 9/2005 | Jiang et al. |
| 6,942,824 B1 | 9/2005 | Li |
| 6,943,993 B2 | 9/2005 | Chang et al. |
| 6,944,938 B1 | 9/2005 | Crue, Jr. et al. |
| 6,947,258 B1 | 9/2005 | Li |
| 6,950,266 B1 | 9/2005 | McCaslin et al. |
| 6,954,332 B1 | 10/2005 | Hong et al. |
| 6,958,885 B1 | 10/2005 | Chen et al. |
| 6,961,221 B1 | 11/2005 | Niu et al. |
| 6,969,989 B1 | 11/2005 | Mei |
| 6,975,486 B2 | 12/2005 | Chen et al. |
| 6,987,643 B1 | 1/2006 | Seagle |
| 6,989,962 B1 | 1/2006 | Dong et al. |
| 6,989,972 B1 | 1/2006 | Stoev et al. |
| 7,006,327 B2 | 2/2006 | Krounbi et al. |
| 7,007,372 B1 | 3/2006 | Chen et al. |
| 7,012,832 B1 | 3/2006 | Sin et al. |
| 7,023,658 B1 | 4/2006 | Knapp et al. |
| 7,026,063 B2 | 4/2006 | Ueno et al. |
| 7,027,268 B1 | 4/2006 | Zhu et al. |
| 7,027,274 B1 | 4/2006 | Sin et al. |
| 7,035,046 B1 | 4/2006 | Young et al. |
| 7,041,985 B1 | 5/2006 | Wang et al. |
| 7,046,490 B1 | 5/2006 | Ueno et al. |
| 7,054,113 B1 | 5/2006 | Seagle et al. |
| 7,057,857 B1 | 6/2006 | Niu et al. |
| 7,059,868 B1 | 6/2006 | Yan |
| 7,092,195 B1 | 8/2006 | Liu et al. |
| 7,110,289 B1 | 9/2006 | Sin et al. |
| 7,111,382 B1 | 9/2006 | Knapp et al. |
| 7,113,366 B1 | 9/2006 | Wang et al. |
| 7,114,241 B2 | 10/2006 | Kubota et al. |
| 7,116,517 B1 | 10/2006 | He et al. |
| 7,124,654 B1 | 10/2006 | Davies et al. |
| 7,126,788 B1 | 10/2006 | Liu et al. |
| 7,126,790 B1 | 10/2006 | Liu et al. |
| 7,131,346 B1 | 11/2006 | Buttar et al. |
| 7,133,253 B1 | 11/2006 | Seagle et al. |
| 7,134,185 B1 | 11/2006 | Knapp et al. |
| 7,154,715 B2 | 12/2006 | Yamanaka et al. |
| 7,170,725 B1 | 1/2007 | Zhou et al. |
| 7,177,117 B1 | 2/2007 | Jiang et al. |
| 7,193,815 B1 | 3/2007 | Stoev et al. |
| 7,196,880 B1 | 3/2007 | Anderson et al. |
| 7,199,974 B1 | 4/2007 | Alfoqaha |
| 7,199,975 B1 | 4/2007 | Pan |
| 7,211,339 B1 | 5/2007 | Seagle et al. |
| 7,212,384 B1 | 5/2007 | Stoev et al. |
| 7,238,292 B1 | 7/2007 | He et al. |
| 7,239,478 B1 | 7/2007 | Sin et al. |
| 7,248,431 B1 | 7/2007 | Liu et al. |
| 7,248,433 B1 | 7/2007 | Stoev et al. |
| 7,248,449 B1 | 7/2007 | Seagle |
| 7,270,896 B2 | 9/2007 | Parkin |
| 7,280,325 B1 | 10/2007 | Pan |
| 7,283,327 B1 | 10/2007 | Liu et al. |
| 7,284,316 B1 | 10/2007 | Huai et al. |
| 7,286,329 B1 | 10/2007 | Chen et al. |
| 7,289,303 B1 | 10/2007 | Sin et al. |
| 7,292,409 B1 | 11/2007 | Stoev et al. |
| 7,296,339 B1 | 11/2007 | Yang et al. |
| 7,307,814 B1 | 12/2007 | Seagle et al. |
| 7,307,818 B1 | 12/2007 | Park et al. |
| 7,310,204 B1 | 12/2007 | Stoev et al. |
| 7,318,947 B1 | 1/2008 | Park et al. |
| 7,333,295 B1 | 2/2008 | Medina et al. |
| 7,337,530 B1 | 3/2008 | Stoev et al. |
| 7,342,752 B1 | 3/2008 | Zhang et al. |
| 7,349,170 B1 | 3/2008 | Rudman et al. |
| 7,349,179 B1 | 3/2008 | He et al. |
| 7,354,664 B1 | 4/2008 | Jiang et al. |
| 7,363,697 B1 | 4/2008 | Dunn et al. |
| 7,371,152 B1 | 5/2008 | Newman |
| 7,372,665 B1 | 5/2008 | Stoev et al. |
| 7,375,926 B1 | 5/2008 | Stoev et al. |
| 7,379,269 B1 | 5/2008 | Krounbi et al. |
| 7,386,933 B1 | 6/2008 | Krounbi et al. |
| 7,389,577 B1 | 6/2008 | Shang et al. |
| 7,417,832 B1 | 8/2008 | Erickson et al. |
| 7,419,891 B1 | 9/2008 | Chen et al. |
| 7,428,124 B1 | 9/2008 | Song et al. |
| 7,430,098 B1 | 9/2008 | Song et al. |
| 7,436,620 B1 | 10/2008 | Kang et al. |
| 7,436,638 B1 | 10/2008 | Pan |
| 7,440,220 B1 | 10/2008 | Kang et al. |

(56) References Cited

U.S. PATENT DOCUMENTS

| | | |
|---|---|---|
| 7,443,632 B1 | 10/2008 | Stoev et al. |
| 7,443,639 B2 | 10/2008 | Parkin |
| 7,444,740 B1 | 11/2008 | Chung et al. |
| 7,493,688 B1 | 2/2009 | Wang et al. |
| 7,508,627 B1 | 3/2009 | Zhang et al. |
| 7,522,377 B1 | 4/2009 | Jiang et al. |
| 7,522,379 B1 | 4/2009 | Krounbi et al. |
| 7,522,382 B1 | 4/2009 | Pan |
| 7,542,246 B1 | 6/2009 | Song et al. |
| 7,551,406 B1 | 6/2009 | Thomas et al. |
| 7,552,523 B1 | 6/2009 | He et al. |
| 7,554,767 B1 | 6/2009 | Hu et al. |
| 7,583,466 B2 | 9/2009 | Kermiche et al. |
| 7,595,967 B1 | 9/2009 | Moon et al. |
| 7,602,033 B2 | 10/2009 | Zhao et al. |
| 7,606,010 B2 | 10/2009 | Parkin |
| 7,639,457 B1 | 12/2009 | Chen et al. |
| 7,646,568 B2 | 1/2010 | Zhang et al. |
| 7,660,080 B1 | 2/2010 | Liu et al. |
| 7,666,467 B2 | 2/2010 | Parkin |
| 7,672,080 B1 | 3/2010 | Tang et al. |
| 7,672,086 B1 | 3/2010 | Jiang |
| 7,684,160 B1 | 3/2010 | Erickson et al. |
| 7,688,546 B1 | 3/2010 | Bai et al. |
| 7,691,434 B1 | 4/2010 | Zhang et al. |
| 7,695,761 B1 | 4/2010 | Shen et al. |
| 7,719,795 B2 | 5/2010 | Hu et al. |
| 7,726,009 B1 | 6/2010 | Liu et al. |
| 7,729,086 B1 | 6/2010 | Song et al. |
| 7,729,087 B1 | 6/2010 | Stoev et al. |
| 7,736,823 B1 | 6/2010 | Wang et al. |
| 7,785,666 B1 | 8/2010 | Sun et al. |
| 7,796,356 B1 | 9/2010 | Fowler et al. |
| 7,800,858 B1 | 9/2010 | Bajikar et al. |
| 7,807,218 B2 | 10/2010 | Parkin |
| 7,819,979 B1 | 10/2010 | Chen et al. |
| 7,829,264 B1 | 11/2010 | Wang et al. |
| 7,846,643 B1 | 12/2010 | Sun et al. |
| 7,855,854 B2 | 12/2010 | Hu et al. |
| 7,869,160 B1 | 1/2011 | Pan et al. |
| 7,872,824 B1 | 1/2011 | Macchioni et al. |
| 7,872,833 B2 | 1/2011 | Hu et al. |
| 7,906,231 B2 | 3/2011 | Parkin |
| 7,910,267 B1 | 3/2011 | Zeng et al. |
| 7,911,735 B1 | 3/2011 | Sin et al. |
| 7,911,737 B1 | 3/2011 | Jiang et al. |
| 7,916,426 B2 | 3/2011 | Hu et al. |
| 7,918,013 B1 | 4/2011 | Dunn et al. |
| 7,968,219 B1 | 6/2011 | Jiang et al. |
| 7,982,989 B1 | 7/2011 | Shi et al. |
| 8,008,097 B2 | 8/2011 | Parkin |
| 8,008,912 B1 | 8/2011 | Shang |
| 8,012,804 B1 | 9/2011 | Wang et al. |
| 8,015,692 B1 | 9/2011 | Zhang et al. |
| 8,018,677 B1 | 9/2011 | Chung et al. |
| 8,018,678 B1 | 9/2011 | Zhang et al. |
| 8,024,748 B1 | 9/2011 | Moravec et al. |
| 8,072,705 B1 | 12/2011 | Wang et al. |
| 8,074,345 B1 | 12/2011 | Anguelouch et al. |
| 8,077,418 B1 | 12/2011 | Hu et al. |
| 8,077,434 B1 | 12/2011 | Shen et al. |
| 8,077,435 B1 | 12/2011 | Liu et al. |
| 8,077,557 B1 | 12/2011 | Hu et al. |
| 8,079,135 B1 | 12/2011 | Shen et al. |
| 8,081,403 B1 | 12/2011 | Chen et al. |
| 8,091,210 B1 | 1/2012 | Sasaki et al. |
| 8,097,846 B1 | 1/2012 | Anguelouch et al. |
| 8,104,166 B1 | 1/2012 | Zhang et al. |
| 8,116,043 B2 | 2/2012 | Leng et al. |
| 8,116,171 B1 | 2/2012 | Lee |
| 8,125,856 B1 | 2/2012 | Li et al. |
| 8,134,794 B1 | 3/2012 | Wang |
| 8,136,224 B1 | 3/2012 | Sun et al. |
| 8,136,225 B1 | 3/2012 | Zhang et al. |
| 8,136,805 B1 | 3/2012 | Lee |
| 8,141,235 B1 | 3/2012 | Zhang |
| 8,146,236 B1 | 4/2012 | Luo et al. |
| 8,149,536 B1 | 4/2012 | Yang et al. |
| 8,151,441 B1 | 4/2012 | Rudy et al. |
| 8,163,185 B1 | 4/2012 | Sun et al. |
| 8,164,760 B2 | 4/2012 | Willis |
| 8,164,855 B1 | 4/2012 | Gibbons et al. |
| 8,164,864 B2 | 4/2012 | Kaiser et al. |
| 8,165,709 B1 | 4/2012 | Rudy |
| 8,166,631 B1 | 5/2012 | Tran et al. |
| 8,166,632 B1 | 5/2012 | Zhang et al. |
| 8,169,473 B1 | 5/2012 | Yu et al. |
| 8,171,618 B1 | 5/2012 | Wang et al. |
| 8,179,636 B1 | 5/2012 | Bai et al. |
| 8,191,237 B1 | 6/2012 | Luo et al. |
| 8,194,365 B1 | 6/2012 | Leng et al. |
| 8,194,366 B1 | 6/2012 | Li et al. |
| 8,196,285 B1 | 6/2012 | Zhang et al. |
| 8,200,054 B1 | 6/2012 | Li et al. |
| 8,203,800 B2 | 6/2012 | Li et al. |
| 8,208,350 B1 | 6/2012 | Hu et al. |
| 8,220,140 B1 | 7/2012 | Wang et al. |
| 8,222,599 B1 | 7/2012 | Chien |
| 8,225,488 B1 | 7/2012 | Zhang et al. |
| 8,227,023 B1 | 7/2012 | Liu et al. |
| 8,228,633 B1 | 7/2012 | Tran et al. |
| 8,231,796 B1 | 7/2012 | Li et al. |
| 8,233,248 B1 | 7/2012 | Li et al. |
| 8,248,896 B1 | 8/2012 | Yuan et al. |
| 8,254,060 B1 | 8/2012 | Shi et al. |
| 8,257,597 B1 | 9/2012 | Guan et al. |
| 8,259,410 B1 | 9/2012 | Bai et al. |
| 8,259,539 B1 | 9/2012 | Hu et al. |
| 8,262,918 B1 | 9/2012 | Li et al. |
| 8,262,919 B1 | 9/2012 | Luo et al. |
| 8,264,797 B2 | 9/2012 | Emley |
| 8,264,798 B1 | 9/2012 | Guan et al. |
| 8,270,126 B1 | 9/2012 | Roy et al. |
| 8,276,258 B1 | 10/2012 | Tran et al. |
| 8,277,669 B1 | 10/2012 | Chen et al. |
| 8,279,719 B1 | 10/2012 | Hu et al. |
| 8,284,517 B1 | 10/2012 | Sun et al. |
| 8,288,204 B1 | 10/2012 | Wang et al. |
| 8,289,821 B1 | 10/2012 | Huber |
| 8,291,743 B1 | 10/2012 | Shi et al. |
| 8,307,539 B1 | 11/2012 | Rudy et al. |
| 8,307,540 B1 | 11/2012 | Tran et al. |
| 8,308,921 B1 | 11/2012 | Hiner et al. |
| 8,310,785 B1 | 11/2012 | Zhang et al. |
| 8,310,901 B1 | 11/2012 | Batra et al. |
| 8,315,019 B1 | 11/2012 | Mao et al. |
| 8,316,527 B2 | 11/2012 | Hong et al. |
| 8,320,076 B1 | 11/2012 | Shen et al. |
| 8,320,077 B1 | 11/2012 | Tang et al. |
| 8,320,219 B1 | 11/2012 | Wolf et al. |
| 8,320,220 B1 | 11/2012 | Yuan et al. |
| 8,320,722 B1 | 11/2012 | Yuan et al. |
| 8,322,022 B1 | 12/2012 | Yi et al. |
| 8,322,023 B1 | 12/2012 | Zeng et al. |
| 8,325,569 B1 | 12/2012 | Shi et al. |
| 8,333,008 B1 | 12/2012 | Sin et al. |
| 8,334,093 B2 | 12/2012 | Zhang et al. |
| 8,336,194 B2 | 12/2012 | Yuan et al. |
| 8,339,738 B1 | 12/2012 | Tran et al. |
| 8,341,826 B1 | 1/2013 | Jiang et al. |
| 8,343,319 B1 | 1/2013 | Li et al. |
| 8,343,364 B1 | 1/2013 | Gao et al. |
| 8,349,195 B1 | 1/2013 | Si et al. |
| 8,351,307 B1 | 1/2013 | Wolf et al. |
| 8,357,244 B1 | 1/2013 | Zhao et al. |
| 8,373,945 B1 | 2/2013 | Luo et al. |
| 8,375,564 B1 | 2/2013 | Luo et al. |
| 8,375,565 B2 | 2/2013 | Hu et al. |
| 8,381,391 B2 | 2/2013 | Park et al. |
| 8,385,157 B1 | 2/2013 | Champion et al. |
| 8,385,158 B1 | 2/2013 | Hu et al. |
| 8,394,280 B1 | 3/2013 | Wan et al. |
| 8,400,731 B1 | 3/2013 | Li et al. |
| 8,404,128 B1 | 3/2013 | Zhang et al. |

(56) References Cited

U.S. PATENT DOCUMENTS

| | | |
|---|---|---|
| 8,404,129 B1 | 3/2013 | Luo et al. |
| 8,405,930 B1 | 3/2013 | Li et al. |
| 8,409,453 B1 | 4/2013 | Jiang et al. |
| 8,413,317 B1 | 4/2013 | Wan et al. |
| 8,416,540 B1 | 4/2013 | Li et al. |
| 8,419,953 B1 | 4/2013 | Su et al. |
| 8,419,954 B1 | 4/2013 | Chen et al. |
| 8,422,176 B1 | 4/2013 | Leng et al. |
| 8,422,342 B1 | 4/2013 | Lee |
| 8,422,841 B1 | 4/2013 | Shi et al. |
| 8,424,192 B1 | 4/2013 | Yang et al. |
| 8,441,756 B1 | 5/2013 | Sun et al. |
| 8,443,510 B1 | 5/2013 | Shi et al. |
| 8,444,866 B1 | 5/2013 | Guan et al. |
| 8,449,948 B2 | 5/2013 | Medina et al. |
| 8,451,556 B1 | 5/2013 | Wang et al. |
| 8,451,563 B1 | 5/2013 | Zhang et al. |
| 8,454,846 B1 | 6/2013 | Zhou et al. |
| 8,455,119 B1 | 6/2013 | Jiang et al. |
| 8,456,961 B1 | 6/2013 | Wang et al. |
| 8,456,963 B1 | 6/2013 | Hu et al. |
| 8,456,964 B1 | 6/2013 | Yuan et al. |
| 8,456,966 B1 | 6/2013 | Shi et al. |
| 8,456,967 B1 | 6/2013 | Mallary |
| 8,458,892 B2 | 6/2013 | Si et al. |
| 8,462,592 B1 | 6/2013 | Wolf et al. |
| 8,468,682 B1 | 6/2013 | Zhang |
| 8,472,288 B1 | 6/2013 | Wolf et al. |
| 8,480,911 B1 | 7/2013 | Osugi et al. |
| 8,486,285 B2 | 7/2013 | Zhou et al. |
| 8,486,286 B1 | 7/2013 | Gao et al. |
| 8,488,272 B1 | 7/2013 | Tran et al. |
| 8,491,801 B1 | 7/2013 | Tanner et al. |
| 8,491,802 B1 | 7/2013 | Gao et al. |
| 8,493,693 B1 | 7/2013 | Zheng et al. |
| 8,493,695 B1 | 7/2013 | Kaiser et al. |
| 8,495,813 B1 | 7/2013 | Hu et al. |
| 8,498,084 B1 | 7/2013 | Leng et al. |
| 8,506,828 B1 | 8/2013 | Osugi et al. |
| 8,514,517 B1 | 8/2013 | Batra et al. |
| 8,518,279 B1 | 8/2013 | Wang et al. |
| 8,518,832 B1 | 8/2013 | Yang et al. |
| 8,520,336 B1 | 8/2013 | Liu et al. |
| 8,520,337 B1 | 8/2013 | Liu et al. |
| 8,524,068 B2 | 9/2013 | Medina et al. |
| 8,526,275 B1 | 9/2013 | Yuan et al. |
| 8,531,801 B1 | 9/2013 | Xiao et al. |
| 8,532,450 B1 | 9/2013 | Wang et al. |
| 8,533,937 B1 | 9/2013 | Wang et al. |
| 8,537,494 B1 | 9/2013 | Pan et al. |
| 8,537,495 B1 | 9/2013 | Luo et al. |
| 8,537,502 B1 | 9/2013 | Park et al. |
| 8,545,999 B1 | 10/2013 | Leng et al. |
| 8,547,659 B1 | 10/2013 | Bai et al. |
| 8,547,667 B1 | 10/2013 | Roy et al. |
| 8,547,730 B1 | 10/2013 | Shen et al. |
| 8,555,486 B1 | 10/2013 | Medina et al. |
| 8,559,141 B1 | 10/2013 | Pakala et al. |
| 8,563,146 B1 | 10/2013 | Zhang et al. |
| 8,565,049 B1 | 10/2013 | Tanner et al. |
| 8,576,517 B1 | 11/2013 | Tran et al. |
| 8,578,594 B2 | 11/2013 | Jiang et al. |
| 8,582,238 B1 | 11/2013 | Liu et al. |
| 8,582,241 B1 | 11/2013 | Yu et al. |
| 8,582,253 B1 | 11/2013 | Zheng et al. |
| 8,588,039 B1 | 11/2013 | Shi et al. |
| 8,593,914 B2 | 11/2013 | Wang et al. |
| 8,597,528 B1 | 12/2013 | Roy et al. |
| 8,599,520 B1 | 12/2013 | Liu et al. |
| 8,599,657 B1 | 12/2013 | Lee |
| 8,603,593 B1 | 12/2013 | Roy et al. |
| 8,607,438 B1 | 12/2013 | Gao et al. |
| 8,607,439 B1 | 12/2013 | Wang et al. |
| 8,611,035 B1 | 12/2013 | Bajikar et al. |
| 8,611,054 B1 | 12/2013 | Shang et al. |
| 8,611,055 B1 | 12/2013 | Pakala et al. |
| 8,614,864 B1 | 12/2013 | Hong et al. |
| 8,619,512 B1 | 12/2013 | Yuan et al. |
| 8,625,233 B1 | 1/2014 | Ji et al. |
| 8,625,941 B1 | 1/2014 | Shi et al. |
| 8,628,672 B1 | 1/2014 | Si et al. |
| 8,630,068 B1 | 1/2014 | Mauri et al. |
| 8,634,280 B1 | 1/2014 | Wang et al. |
| 8,638,529 B1 | 1/2014 | Leng et al. |
| 8,643,980 B1 | 2/2014 | Fowler et al. |
| 8,649,123 B1 | 2/2014 | Zhang et al. |
| 8,665,561 B1 | 3/2014 | Knutson et al. |
| 8,670,211 B1 | 3/2014 | Sun et al. |
| 8,670,213 B1 | 3/2014 | Zeng et al. |
| 8,670,214 B1 | 3/2014 | Knutson et al. |
| 8,670,294 B1 | 3/2014 | Shi et al. |
| 8,670,295 B1 | 3/2014 | Hu et al. |
| 8,675,318 B1 | 3/2014 | Ho et al. |
| 8,675,455 B1 | 3/2014 | Krichevsky et al. |
| 8,681,594 B1 | 3/2014 | Shi et al. |
| 8,689,430 B1 | 4/2014 | Chen et al. |
| 8,693,141 B1 | 4/2014 | Elliott et al. |
| 8,703,397 B1 | 4/2014 | Zeng et al. |
| 8,705,205 B1 | 4/2014 | Li et al. |
| 2005/0110004 A1* | 5/2005 | Parkin et al. ............ 257/30 |
| 2005/0201023 A1* | 9/2005 | Huai et al. ........... 360/324.11 |
| 2007/0053114 A1 | 3/2007 | Uesugi et al. |
| 2007/0111332 A1 | 5/2007 | Zhao et al. |
| 2008/0179699 A1 | 7/2008 | Horng et al. |
| 2008/0180864 A1* | 7/2008 | Meguro et al. ....... 360/324.11 |
| 2009/0027810 A1 | 1/2009 | Horng et al. |
| 2010/0124617 A1* | 5/2010 | Matsuzawa et al. ......... 427/470 |
| 2010/0290157 A1 | 11/2010 | Zhang et al. |
| 2010/0320076 A1 | 12/2010 | Zhao et al. |
| 2011/0086240 A1 | 4/2011 | Xiang et al. |
| 2012/0111826 A1 | 5/2012 | Chen et al. |
| 2012/0148735 A1* | 6/2012 | Zhou ......................... 427/129 |
| 2012/0216378 A1 | 8/2012 | Emley et al. |
| 2012/0237878 A1 | 9/2012 | Zeng et al. |
| 2012/0298621 A1 | 11/2012 | Gao |
| 2013/0216702 A1 | 8/2013 | Kaiser et al. |
| 2013/0216863 A1 | 8/2013 | Li et al. |
| 2013/0257421 A1 | 10/2013 | Shang et al. |

\* cited by examiner

METHODS FOR MANUFACTURING A MAGNETORESISTIVE STRUCTURE UTILIZING HEATING AND COOLING

FIELD

Aspects of the present invention relate to magnetoresistive structures, and more particularly methods for manufacturing a magnetoresistive head.

BACKGROUND OF RELATED ART

A tunneling magnetoresistance or magnetoresistive (TMR) reader is a type of magnetic sensor that utilizes a magnetic tunnel junction (MTJ). In general, a TMR reader includes two ferromagnetic layers that are separated by a barrier layer (e.g., MgO). In a current-perpendicular-to-plane (CPP) geometry type TMR structure, the resistance of the structure for a current flowing perpendicular to the barrier layer depends on the relative angle between the magnetization of both ferromagnetic layers. The quality of such a TMR device is characterized by its magnetoresistance ratio (dR/R) that indicates the magnitude change in resistance of a material due to an external magnetic field. The TMR device exhibits magnetoresistance at the magnetic tunnel junction. Generally, the magnetoresistance ratio decreases with both increasing temperature and increasing bias voltage.

The signal-to-noise ratio (SNR) of the TMR reader depends on both the signal (which is proportional to amplitude and thus dR/R of the thin film stack of the TMR reader) and noise. The noise can be partitioned into magnetic noise and electrical noise. While the magnetic noise is correlated to the magnitude of the signal, the electrical noise is proportional to the resistance-area (RA) product of the device. Therefore, the SNR of the TMR reader may be increased by increasing the signal (e.g., increasing the magnetoresistance ratio dR/R of the film stack) and/or reducing the noise (e.g., reducing the RA to decrease electrical noise). In a generally known TMR structure, however, dR/R will typically decrease when RA is reduced (e.g., due to wave function overlap because of the reduced barrier thickness as well as increase in interlayer coupling).

In the related art, in situ-heating has been used after the deposition of the tunnel barrier (e.g., a MgO tunnel barrier layer) to improve the dR/R for a given RA. This is done to improve the crystallinity of the MgO tunnel barrier layer before deposition of the next layer. However, it is desirable to further improve the SNR performance of a TMR device (e.g., a reader).

SUMMARY

Embodiments of the present invention are directed toward tunnel magnetoresistive (TMR) structures and methods for manufacturing the same.

According to an embodiment of the present invention, a method for manufacturing a tunnel magnetoresistive (TMR) structure is provided. The method includes forming a reference layer on a substrate, forming a tunnel barrier layer on the substrate, forming a free layer on the substrate, and heating and cooling the TMR structure after forming the reference layer.

According to another embodiment of the present invention, a method of manufacturing a tunnel magnetoresistive sensor is provided. The method includes providing a substrate, forming a first portion of a magnetic tunnel junction (MTJ) structure on the substrate, forming a second portion of the MTJ structure on the substrate, forming a tunnel barrier layer of the MTJ structure between the first portion and the second portion, heating the first portion of the MTJ structure before forming the tunnel barrier layer or after forming at least a portion of the tunnel barrier layer, and cooling the tunnel barrier layer.

According to another embodiment of the present invention, a method of manufacturing a magnetic tunnel junction (MTJ) head for a magnetic storage device is provided. The method includes providing a substrate, forming a first portion of the MTJ head on the substrate, forming a second portion of the MTJ head on the substrate, forming a tunnel barrier layer of the MTJ head between the first portion and the second portion, heating the first portion of the MTJ head before forming the tunnel barrier layer or after forming at least a portion of the tunnel barrier layer, and cooling the tunnel barrier layer.

BRIEF DESCRIPTION OF THE DRAWINGS

The above and other features and aspects of the present invention will become more apparent by describing in detail embodiments thereof with reference to the attached drawings in which.

DETAILED DESCRIPTION

Aspects of embodiments according to the present invention are directed toward methods for manufacturing a magnetoresistive structure such as a head for a magnetic storage device (e.g., a hard drive). The methods utilize a combination of in-situ heating and in-situ cooling below room temperature (e.g., cryogenic cooling) during the manufacturing process. In the following description of the present invention, processes or constructions that are well-known to one of ordinary skill in the art may be omitted.

Figure 1:
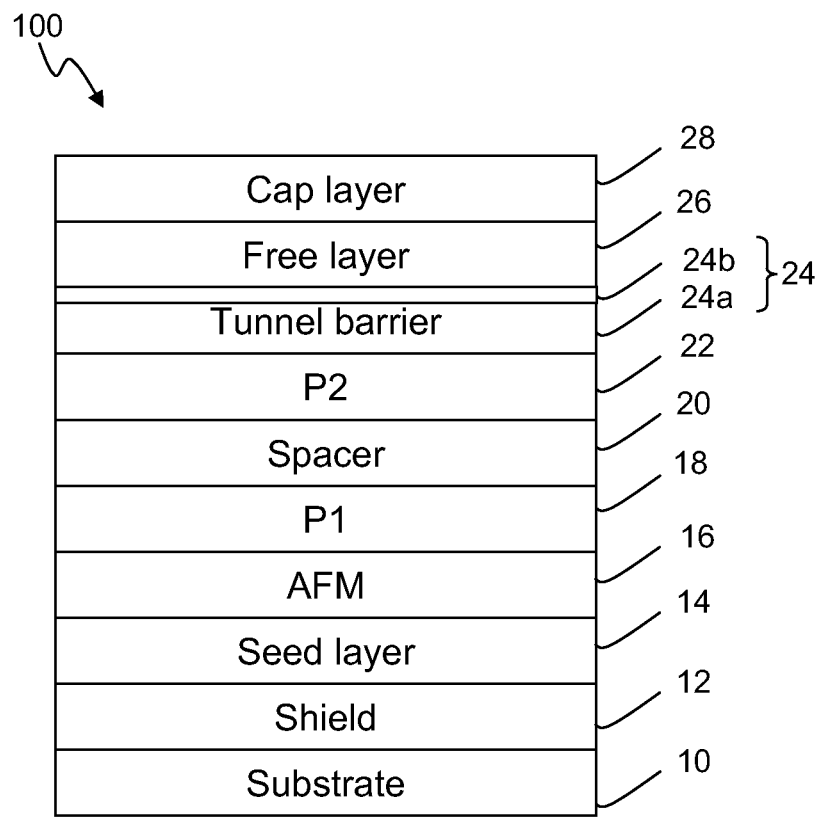
FIG. 1 is a conceptual cross-sectional view of a tunneling magnetoresistance (TMR) structure according to an embodiment of the present invention.

FIG. 1 is a conceptual cross-sectional view of a tunneling magnetoresistance (TMR) structure 100 (e.g., TMR reader) according to an embodiment of the present invention. The TMR structure 100 includes a shield layer 12 on a substrate 10, a seed layer 14 on the shield layer 12, an anti-ferromagnetic (AFM) layer 16 (e.g., Ir—Mn) on the seed layer 14, a P1 layer 18 (e.g., a ferromagnetic layer made of CoFe or CoFeB) on the AFM layer 16, a spacer 20 (e.g., Ru) on the P1 layer 18, a P2 layer 22 (e.g., a ferromagnetic layer made of CoFe or CoFeB) on the spacer 20, a tunnel barrier layer 24 (e.g., MgO) on the P2 layer 22, a free layer 26 (e.g., CoFe/NiFe) on the tunnel barrier layer 24, and a cap layer 28 (e.g., Ta/Ru) on the free layer 26.

In the embodiment of FIG. 1, one or more of the seed layer 14 and the AFM layer 16 may be referred to as a pinning layer, and one or more of the P1 layer 18, the spacer 20, and the P2 layer may be referred to as a pinned layer. One or more of the pinning layer and the pinned layer may be referred to as a reference layer on the substrate 10. For example, the reference layer may denote a combination of the P1 layer 18, the spacer 20, and the P2 layer 22. In another example, the reference layer may denote only the P2 layer 22. In still another example, the reference layer may denote the seed layer 14, the AFM layer 16, the P1 layer 18, the spacer 20, and the P2 layer 22 and other various layers below the tunnel barrier layer 24. However, the present invention is not limited to the above described structure and materials. In some embodiments, some of the various layers may be omitted or substituted by other suitable layers in various order. In some embodiments, the order of the various layers in FIG. 1 is partially or completely reversed. In addition, the thicknesses of the various layers illustrated in the drawings may be exaggerated for clarity and may not be representative of the actual thicknesses.

Processes for fabricating the above described TMR structure 100 of FIG. 1 will be described more fully below according to an embodiment of the present invention. The processes can significantly enhance the dR/R of the TMR structure 100 (e.g., thin film stack) and also help to maintain a reasonable dR/R at low RA. The increase of the dR/R of the TMR structure 100 may be attributed to, but not limited to, an improved lattice matching between the tunnel barrier layer 24 and the free layer 26. In several embodiments, the free layer 26 will remain substantially disordered when deposited on the cold substrate 10 and then only crystallize during the subsequent annealing step to be described in more detail below.

Referring to FIG. 1, the substrate 10 that is made of a suitable material (e.g., AlTiC) is first provided, and the shield layer 12 is deposited on the substrate 10. The surface of the shield layer 12 on the substrate 10 may be etched using conventional plasma treatment to remove any native oxide and contamination. The above described layers of the TMR structure 100 shown in FIG. 1 are sequentially deposited until the tunnel barrier layer 24 is deposited. In several embodiments, the tunnel barrier layer 24 may be a MgO layer or a MgO/Mg layer. In other embodiments, other suitable materials can be used. Then, the partially formed TMR structure 100 is heated to between about 50° C. and about 400° C., inclusive. In several embodiments, the partially formed TMR structure 100 can be heated within a smaller range between 100° C. and about 300° C., inclusive. The heating process may be performed in a suitable heating chamber, and the heating time can be between about one minute and about fifty minutes, inclusive. In several embodiments, the heating time can be in a smaller range that is between about five minutes and about fifteen minutes, inclusive.

After heating, the partially formed TMR structure 100 is sent to a cooling chamber or cooling station for cooling. During cooling, the TMR structure 100 is cooled to a temperature between about −223° C. (50K) to about 20° C. (293K), inclusive. In several embodiments, the cooling temperature is between about −173° C. (100K) and about 0° C. (273K). The cooling time can be between about five minutes and about sixty minutes, inclusive. In several embodiments, the cooling time can be in a smaller range of between about ten minutes and about thirty minutes, inclusive. It should be understood that the above recited temperatures and time durations used in the heating and cooling processes are illustrative embodiments, and the present invention is not limited thereto. Therefore, in other embodiments, other suitable temperatures and heating/cooling time may be used.

In some embodiments, the tunnel barrier layer 24 includes a tunnel barrier layer 24a (e.g., a MgO layer) and an interlayer 24b (e.g., a layer of Mg, Zn, Al, AlSi, Ca, Si, or other suitable materials) deposited on the tunnel barrier layer 24a. The heating and cooling of the TMR structure 100 may be performed in different orders. In several embodiments, the heating step may be performed before or after at least a part of the tunnel barrier layer 24a is deposited, and before or after the interlayer 24b is formed. After the heating step is performed, the cooling step may be performed before or after the interlayer 24b is formed, and before or after at least a part of the free layer 26 is formed. In several embodiments, the cooling step is performed after a portion of the free layer 26 is formed. After cooling, the cap layer 28 is deposited on the cooled partially formed TMR structure 100 to completely form the TMR structure 100. Subsequently, optimized high vacuum field annealing is performed on the completed TMR structure 100.

Figure 2:
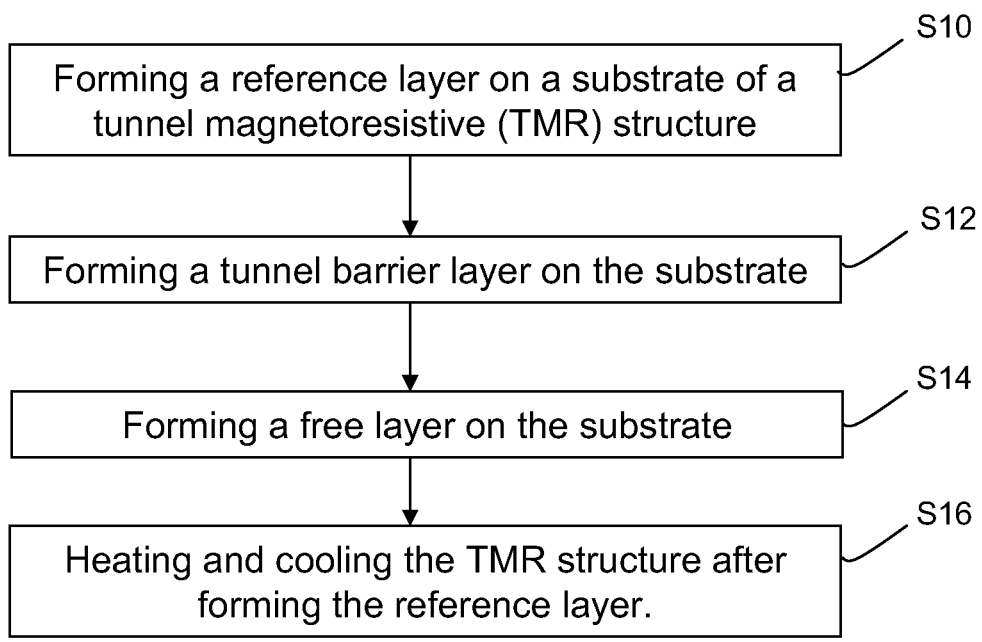
FIG. 2 is a flowchart illustrating a method for manufacturing a TMR structure according to an embodiment of the present invention.

FIG. 2 is a flowchart illustrating a process for manufacturing a TMR structure according to an embodiment of the present invention. In particular embodiments, the process can be used to form the TMR structure of FIG. 1. According to the process of FIG. 2, a reference layer is formed on a suitable substrate (S10), a tunnel barrier layer is formed on the substrate (S12), and a free layer is formed on the substrate (S14). In addition, heating and cooling of the TMR structure is performed after forming the reference tunnel barrier layer (S16). Although the steps S10, S12, S14, and S16 are illustrated in FIG. 2 in a particular order. The present invention is not limited thereto. To the contrary, the order of these steps may be performed in various suitable orders. In one embodiment, the process can perform the sequence of actions in a different order. In another embodiment, the process can skip one or more of the actions. In other embodiments, one or more of the actions are performed simultaneously. In some embodiments, additional actions can be performed. Also, it is noted that the above disclosed process may not include all the various steps of manufacturing a TMR structure because some steps or processes that are generally known in the art and not necessary for the understanding of the present invention may be omitted for clarity.

Figure 3:
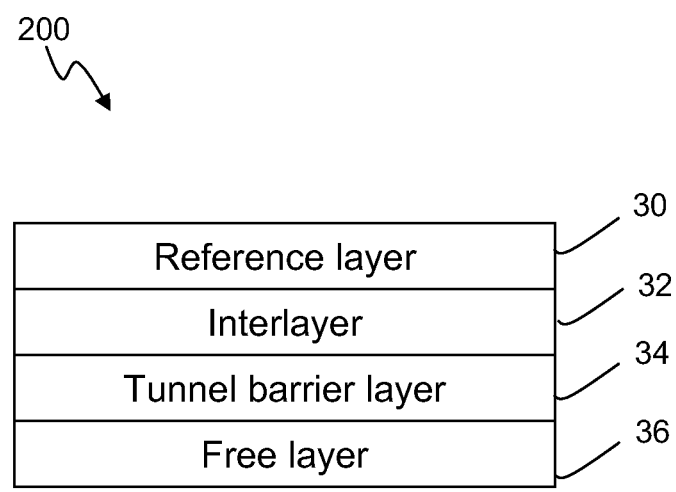
FIG. 3 is a conceptual cross-sectional view of a tunneling magnetoresistance (TMR) structure according to an embodiment of the present invention.

FIG. 3 is a conceptual cross-sectional view of a tunneling magnetoresistance (TMR) structure 200 according to an embodiment of the present invention. In FIG. 3, the order in which the various layers of the TMR structure 200 are formed has a reversed order as compared to the TMR structure 100 of FIG. 1. During fabrication, the heating and cooling of the TMR structure 200 may be performed in various suitable orders. After forming the free layer 36, the heating step may be performed before or after at least a part of the tunnel barrier layer 34 is deposited, and before or after the interlayer 32 is formed. After the heating step is performed, the cooling step may be performed before or after at least a part of the interlayer 32 is formed, and before or after at least a part of the reference layer 30 is formed. A description of some of the processes used during the fabrication of the TMR structure 200 that are substantially similar to those of the TMR structure 100 is omitted for clarity. For example, the above described heating and cooling temperatures and time durations in reference to the embodiment of FIG. 1 are applicable in the fabrication of the TMR structure 200 of FIG. 3.

Figure 4:
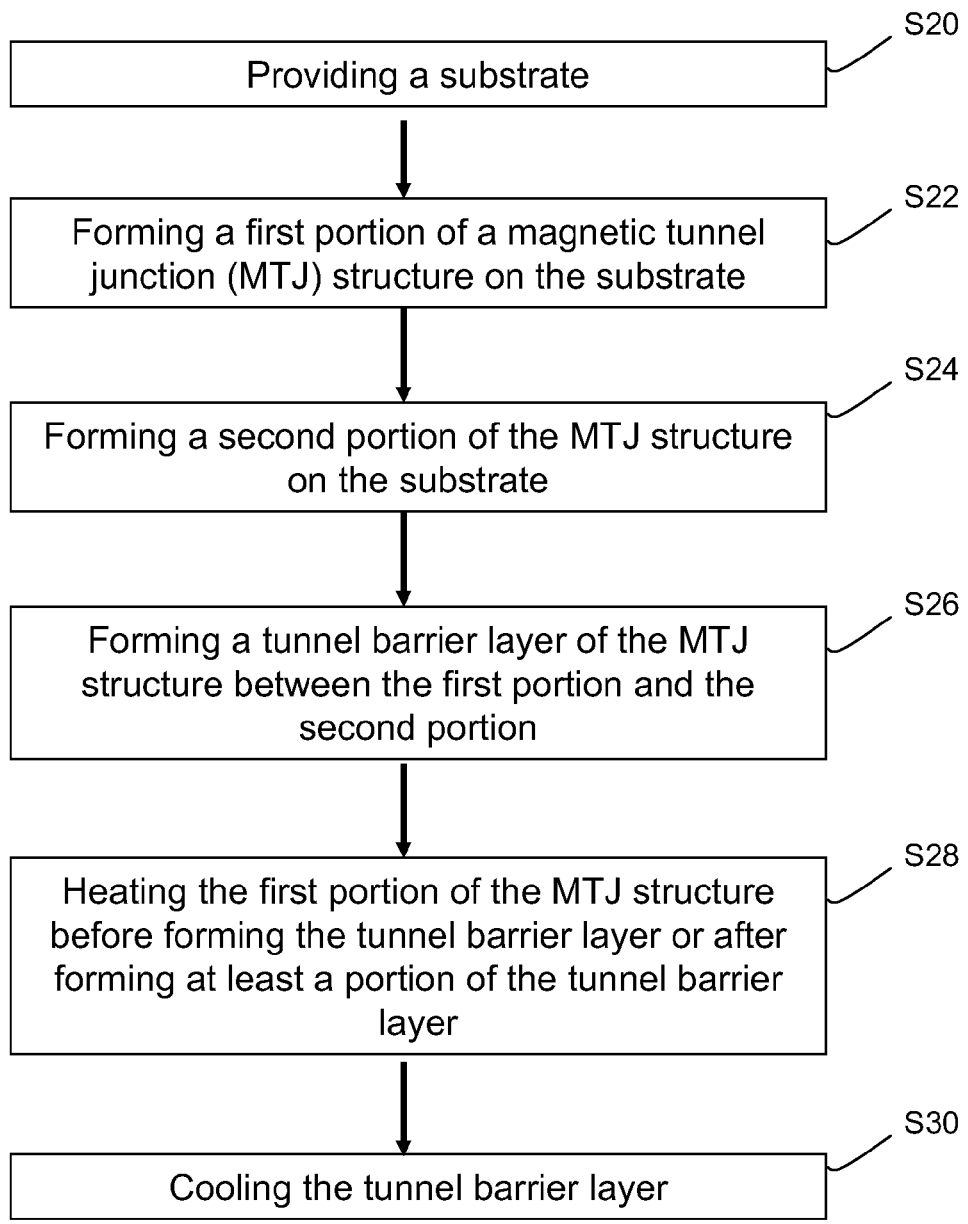
FIG. 4 is a flowchart illustrating another method for manufacturing a TMR structure according to an embodiment of the present invention.

FIG. 4 is a flowchart illustrating another process for manufacturing a TMR structure according to an embodiment of the present invention. In particular embodiments, the process can be used to form the TMR structure of FIG. 3. According to the process of FIG. 4, a suitable substrate is provided (S20), a first portion of a magnetic tunnel junction (MTJ) structure is formed on the substrate (S22), a second portion of the MTJ structure is formed on the substrate (S24), and a tunnel barrier layer of the MTJ structure is formed between the first portion and the second portion (S26). In addition, the first portion of the MTJ structure is heated before forming the tunnel barrier layer or after forming at least a portion of the tunnel barrier layer (S28). After heating, cooling is performed on the tunnel barrier layer (S30). Although steps S20 through S30 are shown in a particular order in FIG. 4, the present invention is not limited thereto. To the contrary, steps S20 through S30 temperatures (e.g., room temperature), the resulting TMR increase may be smaller. However, even if the TMR structure 100 or 200 is only cooled back to room temperature, one can still observe a TMR increase. Cooling to room temperature (i.e., not to cryogenic temperature) can also be carried out by simply letting the TMR structure to cool down for a period of time after the heating process.

In several embodiments, the heating and cooling steps may be performed in various different orders as illustrated in the table below.

Reference layer/Tunnel barrier/Heating/Cooling/Interlayer/Free layer
Reference layer/Tunnel barrier/Heating/Interlayer/Cooling/Free layer
Reference layer/Tunnel barrier/Interlayer/Heating/Cooling/Free layer
Reference layer/Tunnel barrier/Interlayer/Heating/Free layer part1/Cooling/Free layer part2
Reference layer/Tunnel barrier/Heating/Interlayer/Free layer part1/Cooling/Free layer part2
Reference layer/Tunnel barrier part1/Heating/Tunnel barrier part2/Cooling/Interlayer/Free layer
Reference layer/Tunnel barrier part1/Heating/Tunnel barrier part2/Interlayer/Cooling/Free layer
Reference layer/Tunnel barrier part 1/Heating/Tunnel barrier part2/Interlayer/Free layer part1/Cooling/Free layer part2
Reference layer/Heating/Tunnel barrier/Cooling/Interlayer/Free layer
Reference layer/Heating/Tunnel barrier/Interlayer/Cooling/Free layer
Reference layer/Heating/Tunnel barrier/Interlayer/Free layer part1/Cooling/Free layer part2
Free Layer/Tunnel barrier/Heating/Cooling/Interlayer/Reference Layer
Free Layer/Tunnel barrier/Heating/Interlayer/Cooling/Reference Layer
Free Layer/Tunnel barrier/Interlayer/Heating/Cooling/Reference Layer
Free Layer/Tunnel barrier/Interlayer/Heating/Reference Layer part1/Cooling/Reference Layer part2
Free Layer/Tunnel barrier/Heating/Interlayer/Reference Layer part1/Cooling/Reference Layer part2
Free Layer/Tunnel barrier part1/Heating/Tunnel barrier part2/Cooling/Interlayer/Reference Layer
Free Layer/Tunnel barrier part1/Heating/Tunnel barrier part2/Interlayer/Cooling/Reference Layer
Free Layer/Tunnel barrier part 1/Heating/Tunnel barrier part2/Interlayer/Reference Layer part1/Cooling/Reference Layer part2
Free Layer/Heating/Tunnel barrier/Cooling/Interlayer/Reference Layer
Free Layer/Heating/Tunnel barrier/Interlayer/Cooling/Reference Layer
Free Layer/Heating/Tunnel barrier/Interlayer/Reference Layer part1/Cooling/Reference Layer part2 may be performed in various suitable orders. In one embodiment, the process can perform the sequence of actions in a different order. In another embodiment, the process can skip one or more of the actions. In other embodiments, one or more of the actions are performed simultaneously. In some embodiments, additional actions can be performed. Also, it is noted that the above disclosed process may not include all the various steps of manufacturing a TMR structure because some steps or processes that are generally known in the art and not necessary for the understanding of the present invention may be omitted for clarity.

Figure 5:
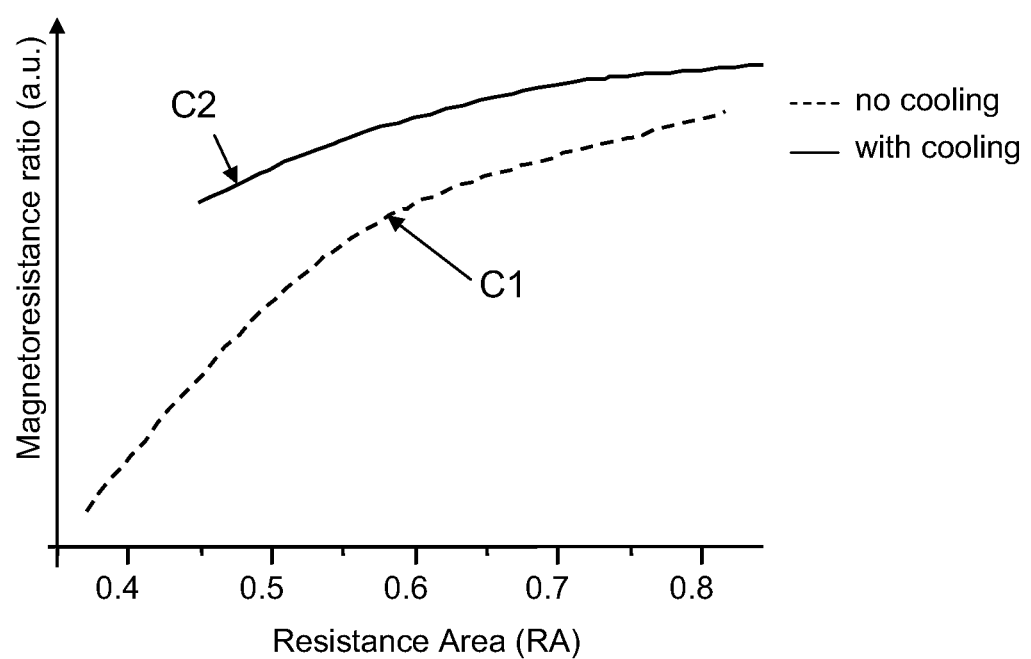
FIG. 5 is a graph illustrating a comparison of magnetoresistance between a TMR structure of a comparative example and a TMR structure according to an embodiment of the present invention.

FIG. 5 is a graph illustrating a comparison of magnetoresistance between a TMR structure of a comparative example and a TMR structure according to an embodiment of the present invention. The vertical axis and horizontal axis of FIG. 5 represent magnetoresistance (MR) in arbitrary units and RA, respectively. In FIG. 5, the lower curve C1 represents the magnetoresistance—of the TMR structure of the comparative example in which no cooling process was performed, and the upper curve C2 represents the magnetoresistance—of the TMR structure according to the embodiment of the present invention in which cooling process was performed after heating. It can be seen in FIG. 5 that the magnetoresistance of the embodiment is substantially increased when cooling is performed during fabrication. That is, for the same RA, higher magnetoresistance (i.e., curve C2) is observed for the TMR structure fabricated according to the embodiment. Therefore, the SNR of the TMR structure fabricated according to the embodiment of the present invention may be improved.

In the above described embodiments, the cooling process may be performed in cryogenic temperature range (e.g., about 100K), and if the cooling process is performed at higher It is noted that the above table is not an exhaustive list of all the possible combinations according to the present invention. To the contrary, other suitable orders of performing the various steps are possible according to the present invention. In each of the above combinations, the process starts from the leftmost step to the rightmost step. In some combinations, a particular layer may be formed in two steps (e.g., part 1 and part 2) with an intervening heating or cooling step.

In several embodiments, the above described methods may be used to fabricate a head (e.g., magnetic tunnel junction head) of a magnetic storage device (e.g., a hard drive).

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A method for manufacturing a tunnel magnetoresistive (TMR) structure, the method comprising:
    forming a reference layer on a substrate;
    forming a tunnel barrier layer on the substrate;
    forming a free layer on the substrate;
    heating the TMR structure after forming at least the reference layer and at least a portion of the tunnel barrier layer; and
    cryogenically cooling, after the heating, the TMR structure after forming the tunnel barrier layer.

2. The method of claim 1, wherein the tunnel barrier layer is positioned between the reference layer and the free layer.

3. The method of claim 1, wherein the reference layer is positioned between the substrate and the tunnel barrier layer.

4. The method of claim 1, wherein the free layer is positioned between the substrate and the tunnel barrier layer.

5. The method of claim 1, wherein the cryogenically cooling the TMR structure comprises cooling the TMR structure after a portion of the free layer is formed.

6. The method of claim 1, wherein the cryogenically cooling the TMR structure comprises cooling the TMR structure before the free layer is formed.

7. The method of claim 1, wherein the tunnel barrier layer comprises an MgO layer.

8. The method of claim 1, further comprising annealing the TMR structure in a vacuum.

9. The method of claim 1,
wherein the heating the TMR structure comprises heating the TMR structure from a first temperature to a second temperature, and
wherein the cryogenically cooling the TMR structure comprises cooling the TMR structure to a third temperature that is lower than the first temperature.

10. The method of claim 9, wherein the second temperature is between about 50° C. and about 400° C., inclusive.

11. The method of claim 10, wherein the second temperature is between about 100° C. and about 300° C., inclusive.

12. The method of claim 9, wherein the heating the TMR structure comprises heating the TMR structure for a heating time period between about one minute and about fifty minutes, inclusive.

13. The method of claim 12, wherein the heating time period is between about five minutes and about fifteen minutes, inclusive.

14. The method of claim 9, wherein the third temperature is between about −223° C. and about 20° C., inclusive.

15. The method of claim 14, wherein the third temperature is between about −173° C. and about 0° C., inclusive.

16. The method of claim 9, wherein the cryogenically cooling the TMR structure comprises cooling the TMR structure for a cooling time period between about five minutes and about sixty minutes, inclusive.

17. The method of claim 16, wherein the cooling time period is between about ten minutes and about thirty minutes, inclusive.

18. The method of claim 1, further comprising forming an interlayer on the tunnel barrier layer.

19. The method of claim 18, wherein the cryogenically cooling the TMR structure comprises cooling the TMR structure before forming the interlayer.

20. The method of claim 18, wherein the cryogenically cooling the TMR structure comprises cooling the TMR structure after forming the interlayer and prior to forming the free layer.

21. The method of claim 18,
wherein the heating the TMR structure comprises heating the TMR structure before forming the interlayer, and
wherein the cryogenically cooling the TMR structure comprises cooling the TMR structure after forming the interlayer, prior to forming the free layer.

22. The method of claim 18, wherein the interlayer comprises a material selected from the group consisting of Mg, Zn, Al, AlSi, Ca, and Si.

23. The method of claim 1, wherein the reference layer comprises:
a seed layer on the substrate;
a pinning layer on the seed layer; and
a pinned layer on the pinning layer.

24. The method of claim 23, further comprising forming a cap layer on the free layer.

25. A method of manufacturing a tunnel magnetoresistive sensor, the method comprising:
providing a substrate;
forming a first portion of a magnetic tunnel junction (MTJ) structure on the substrate;
forming a second portion of the MTJ structure on the substrate;
forming a tunnel barrier layer of the MTJ structure between the first portion and the second portion;
heating the first portion of the MTJ structure after forming at least a portion of the tunnel barrier layer; and
cryogenically cooling, after the heating, the MTJ structure after forming the tunnel barrier layer.

26. The method of claim 25, further comprising forming an interlayer on the tunnel barrier layer, wherein the cryogenically cooling the tunnel barrier layer comprises cryogenically cooling the tunnel barrier layer before or after forming the interlayer.

27. The method of claim 26, wherein the interlayer comprises a material selected from the group consisting of Mg, Zn, Al, AlSi, CA, and Si.

28. The method of claim 26,
wherein the first portion of the MTJ structure comprises a reference layer,
wherein the second portion of the MTJ structure comprises a free layer, and
wherein the cryogenically cooling the tunnel barrier layer comprises cryogenically cooling the tunnel barrier layer after forming a portion of the free layer or a portion of the reference layer.

29. The method of claim 26,
wherein the first portion of the MTJ structure comprises a free layer,
wherein the second portion of the MTJ structure comprises a reference layer, and
wherein the cryogenically cooling the tunnel barrier layer comprises cryogenically cooling the first portion before forming the reference layer.

30. A method of manufacturing a magnetic tunnel junction (MTJ) head for a magnetic storage device, the method comprising:
providing a substrate;
forming a first portion of the MTJ head on the substrate;
forming a second portion of the MTJ head on the substrate;
forming a tunnel barrier layer of the MTJ head between the first portion and the second portion;
heating the first portion of the MTJ head after forming at least a portion of the tunnel barrier layer; and
cryogenically cooling, after the heating, the MTJ head after forming the tunnel barrier layer.

* * * * *